US012768715B2

(12) United States Patent
Evgeny et al.

(10) Patent No.: US 12,768,715 B2
(45) Date of Patent: Oct. 20, 2026

(54) NEAR INFRARED SPECTROMETRY DEVICE

(71) Applicant: Tower Semiconductor Ltd., Migdal Haemek (IL)

(72) Inventors: Pikhay Evgeny, Haifa (IL); Niv Mizrahi, Migdal Haemek (IL); Yakov Roizin, Afula (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 162 days.

(21) Appl. No.: 18/762,556

(22) Filed: Jul. 2, 2024

(65) Prior Publication Data

US 2026/0009677 A1 Jan. 8, 2026

(51) Int. Cl.

| | |
|---|---|
| ***G01J 3/00*** | (2006.01) |
| ***G01J 3/02*** | (2006.01) |
| ***G01J 3/42*** | (2006.01) |
| ***H10F 39/15*** | (2025.01) |

(52) U.S. Cl.

CPC ........... *G01J 3/0262* (2013.01); *G01J 3/0256* (2013.01); *G01J 3/42* (2013.01); *H10F 39/151* (2025.01); *H10F 39/1515* (2025.01); *H10F 39/157* (2025.01)

(58) Field of Classification Search

CPC .......... G01J 3/0256; G01J 3/0262; G01J 3/42; H10F 39/107; H10F 39/151; H10F 39/1515; H10F 39/157

See application file for complete search history.

(56) References Cited

U.S. PATENT DOCUMENTS

| | | | | |
|---|---|---|---|---|
| 6,025,585 | A | 2/2000 | Holla | |
| 7,566,875 | B2 | 7/2009 | Starikov | |
| 11,041,968 | B2 | 6/2021 | Danielsson | |
| 11,329,239 | B2 | 5/2022 | Zhu | |
| 2009/0297095 | A1* | 12/2009 | Matsuoka | B29D 11/00663 264/1.28 |
| 2017/0323982 | A1* | 11/2017 | Scarpulla | H10D 8/60 |
| 2019/0378681 | A1* | 12/2019 | Stejskal | H01J 37/20 |

* cited by examiner

*Primary Examiner* — Dani Fox

(74) *Attorney, Agent, or Firm* — Reches Patents

(57) ABSTRACT

A NIR spectrometry device that includes different NIR PIN diodes (NPDs) and a guard PIN diode (VLPD) that are operated in a fully depletion mode. The different NPDs are located at different lateral positions corresponding to absorption depths of different NIR wavelengths. Each NPD is configured to collect electron-hole pairs (EHPs) generated by radiation that passes through a side edge of the device at a wavelength having an absorption depth that corresponds to a lateral position of the NPD. The VLPD is located at a lateral position that corresponds to a distance from the side edge that exceeds an absorption depth of visible light. The VLPD is configured to collect EHPs generated by unwanted radiation that passed through the side edge of the NIR spectrometry device and to prevent the EHPs generated by unwanted radiation to reach any of the different NPDs.

20 Claims, 9 Drawing Sheets

11

200

NEAR INFRARED SPECTROMETRY DEVICE

BACKGROUND OF THE INVENTION

Near infrared radiation refers to radiation between 800 to 2500 nanometer.

There are various applications that require sensing near infrared radiation—such as industrial applications and defense applications that require fast detection of optical signals in the near infrared—in particular visual flame detectors (800-1100 nm), jet or rocket nozzles detector, and the like.

Silicon based near infrared detector that use their top for receiving the near infrared radiation are very thick—as the penetration depth of the near infrared radiation exceeds a few centimeters.

Furthermore—the near infrared is usually accompanied by visible light and near infrared radiation that introduce significant noise.

There is a growing need to provide a reliable and compact near infrared spectrometry device.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
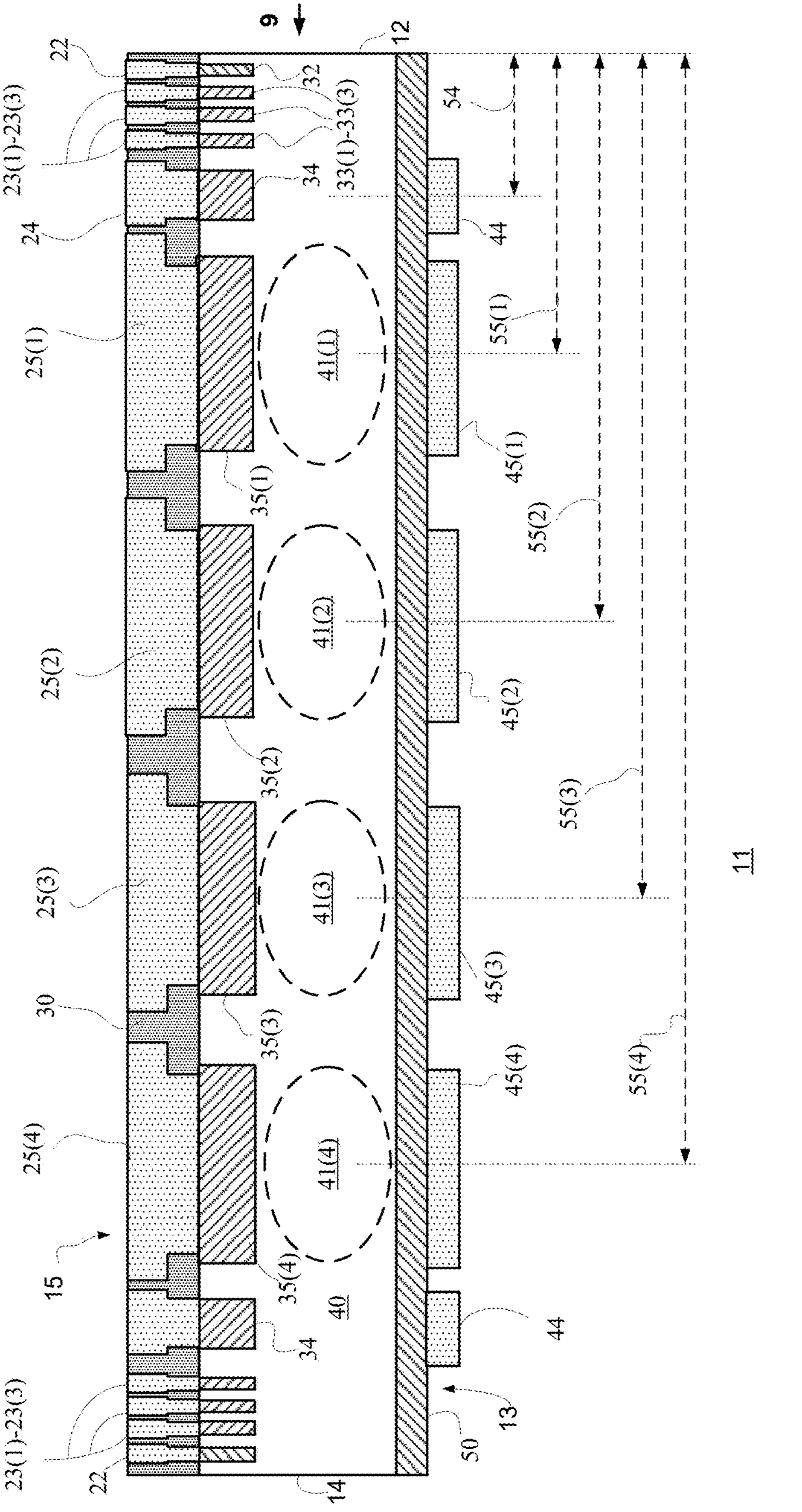
FIG. 1 illustrates an example of a cross sectional view of a near infrared spectrometry device.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

Unwanted radiation includes ultraviolet radiation and/or visible light. The radiation is unwanted in the sense that it differs from near infrared radiation to be detected and may introduce noise or otherwise reduce the accuracy of measurement of a near infrared spectrometry device.

There is provided a near infrared spectrometry device that includes multiple PIN diodes.

The multiple PIN diodes includes different near infrared PIN diodes and a guard PIN diode.

The different near infrared PIN diodes are spaced apart from each other and are located at different lateral positions that correspond to absorption depths of different wavelengths within the near infrared wavelength range.

Each near infrared PIN diode of the different near infrared PIN diodes, once operated in a fully depletion mode, is configured to collect electron-hole pairs generated by radiation that passes through a side edge of the near infrared spectrometry device at a wavelength having an absorption depth that corresponds to a lateral position of the PIN diode.

The guard PIN diode is located at a lateral position that corresponds to a distance from the side edge that exceeds an absorption depth of unwanted radiation, wherein once operated in the fully depletion mode, the guard PIN diode is configured to collect electron-hole pairs generated by unwanted radiation that passed through the side edge of the near infrared spectrometry device and to prevent the electron-hole pairs generated by unwanted radiation to reach any of the different near infrared PIN diodes.

According to an embodiment, the near infrared spectrometry device according to claim, comprising one or more floating guard rings that surround the multiple PIN diodes.

According to an embodiment, the near infrared spectrometry device includes an external floating ring that surrounds the one or more floating guard rings.

According to an embodiment, the external floating ring is in contact with a semiconductor region that is doped with a same type of dopant as the multiple PIN diodes.

According to an embodiment, the near infrared spectrometry device includes one or more shielding elements that are configured to shield a top of the near infrared spectrometry device from unwanted radiation.

According to an embodiment, the near infrared spectrometry device includes one or more shielding elements that are configured to shield another side edge of the near infrared spectrometry device from unwanted radiation.

According to an embodiment, the near infrared spectrometry device includes continuous backside metal contact that is electrically coupled to n-type semiconductor regions of the different PIN diodes.

According to an embodiment, each PIN diode of the multiple PIN diodes comprises a p-type semiconductor region, and wherein each p-type semiconductor region is electrically coupled to a metal contact.

According to an embodiment, the near infrared spectrometry device includes a biasing circuit that is configured to bias the multiple PIN diodes to operate in the fully depletion mode.

According to an embodiment, the different near infrared PIN diodes are of a same width.

According to an embodiment, the different near infrared PIN diodes comprise two near infrared PIN diodes that differ from each other by width.

There is provided a method for near infrared spectrometry, according to an embodiment the method includes:

a. Exposing a side edge of the near infrared spectrometry device to near infrared radiation.

b. Detecting different near infrared wavelengths of the near infrared radiation by different near infrared PIN diodes while operating in a fully depletion mode, the different near infrared PIN diodes are spaced apart from each other and are located at different lateral positions that correspond to absorption depths of the different wavelengths of the near infrared radiation. The detecting includes collecting, by each near infrared PIN diode of the different near infrared PIN diodes, electron-hole pairs generated by the radiation device at a wavelength having an absorption depth that corresponds to a lateral position of the near infrared PIN diode.

c. Collecting, by the guard PIN diode while operating in the fully depletion mode, electron-hole pairs generated by unwanted radiation that passed through the side edge of the near infrared spectrometry device and preventing, by the guard PIN diode, the electron-hole pairs generated by unwanted radiation to reach any of the different near infrared PIN diodes.

According to an embodiment, the method includes preventing damage, by one or more floating guard rings of the near infrared spectrometry device, due to potential differences between multiple PIN diodes and an exterior of the multiple PIN diodes, the multiple PIN diodes comprises the different near infrared PIN diodes and the guard PIN diode.

According to an embodiment, the method includes equalizing a potential outside the one or more floating guard rings by an external floating ring that surrounds the one or more floating guard rings.

According to an embodiment, the method includes shielding a top of the near infrared spectrometry device from unwanted radiation by one or more shielding elements.

According to an embodiment, the method includes shielding another side edge of the near infrared spectrometry device from unwanted radiation by one or more shielding elements According to an embodiment, the biasing includes supplying a bias signal to a continuous backside metal contact that is electrically coupled to n-type semiconductor regions of the different near infrared PIN diodes.

According to an embodiment, each PIN diode of multiple PIN diodes comprises a p-type semiconductor region, and wherein each p-type semiconductor region is electrically coupled to a metal contact, the multiple PIN diodes comprises the different near infrared PIN diodes and the guard PIN diode.

According to an embodiment, the different near infrared PIN diodes are of a same width.

According to an embodiment, the different near infrared PIN diodes comprise two PIN diodes that differ from each other by width.

In FIGS. 1-8 the near infrared spectrometry device is illustrated as including four different near infrared PIN diodes, a single guard PIN diode, three floating guard rings and an external floating ring. It should be noted that this is an example. For example—the number of infrared PIN diodes may differ from four, there may be one, two or more than four floating guard rings, and the like. The locations of at least one of the different near infrared PIN diodes may differ from those illustrated in FIGS. 1-8—and may result in a detection of one or more other near infrared wavelength. There may be no an external floating ring, and the like.

FIG. 1 illustrates near infrared spectrometry device 11 as including:

a. Top 15, a side edge 12 through which radiation 9 passes, bottom 13, and another side edge 14.

b. Metal contacts such as external floating ring top contact 22, floating guard rings top contacts 23(1)-23(3), guard PIN diode top contact 24, different near infrared PIN diodes top contacts 25(1)-25(4), guard PIN diode bottom contact 44, and different near infrared PIN diodes bottom contacts 45(1)-45(4).

c. N-type region 32 of external floating ring.

d. P-type regions such as floating guard rings p-type regions 33(1)-33(3), guard PIN diode p-type region 34, different near infrared PIN diodes p-type regions 35(1)-35(4).

e. N-type region 50.

f. Top oxide region 30 in which the top contacts are formed.

FIG. 1 also illustrates the collection regions 41(1)-41(4) of the four different near infrared PIN diodes.

FIG. 1 also illustrates the distance between the side edge 12 and each one of the centers of collection regions of the guard PIN diode and the different near infrared PIN diodes.

An initial distance 54 between the center of the collection region of the guard PIN diode is set so that a distal end of the collection region of the guard PIN diode exceeds the absorption distance of unwanted radiation that enters from the side edge 12—so that electron-hole pairs generated in the near infrared spectrometry device are collected by the guard PIN diode and do not reach any of the different near infrared PIN diodes. The proximal end of the guard PIN diode (closed to the first side edge) may be located beyond the reach (at a distance from the first side edge that exceeds the penetration depth) of thew unwanted radiation. Alternatively, the unwanted radiation may reach at least a part of the collection region of the guard PIN diode.

The position of the first collection region 41(1) (illustrated by a first distance 55(1) between the center of the first collection region 41(1) and the side edge 12) is set to allow the first near infrared PIN diode to collect electron-hole pairs generated in the near infrared spectrometry device due to a passage of near infrared radiation of a first near infrared wavelength to be collected by the first near infrared PIN diode.

The position of the second collection region 41(2) (illustrated by a second distance 55(2) between the center of the second collection region 41(2) and the side edge 12) is set to allow the second near infrared PIN diode to collect electron-hole pairs generated in the near infrared spectrometry device due to a passage of near infrared radiation of a second near infrared wavelength to be collected by the second near infrared PIN diode.

The position of the third collection region 41(3) (illustrated by a third distance 55(3) between the center of the third collection region 41(3) and the side edge 12) is set to allow the third near infrared PIN diode to collect electron-hole pairs generated in the near infrared spectrometry device due to a passage of near infrared radiation of a third near infrared wavelength to be collected by the third near infrared PIN diode.

The position of the fourth collection region 41(4) (illustrated by a fourth distance 55(4) between the center of the fourth collection region 41(4) and the side edge 12) is set to allow the fourth near infrared PIN diode to collect electron-hole pairs generated in the near infrared spectrometry device due to a passage of near infrared radiation of a fourth near infrared wavelength to be collected by the fourth near infrared PIN diode.

According to an embodiment the thickness of the near infrared spectrometry device ranges between 300 to 1000 microns.

Figure 2:
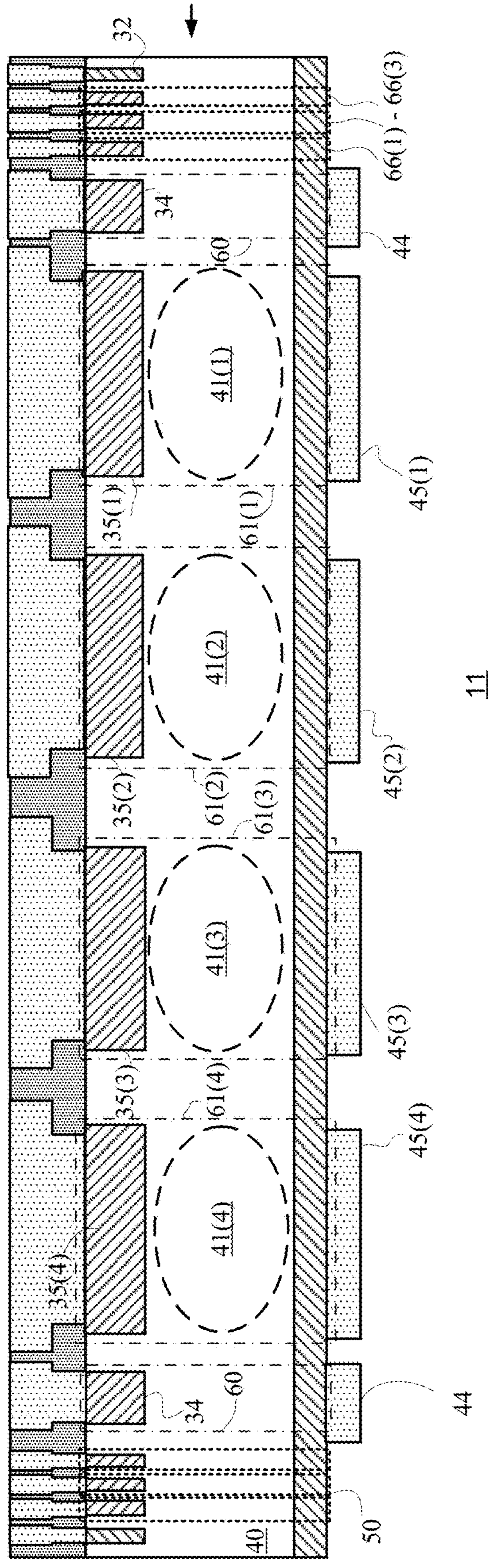
FIG. 2 illustrates an example of a cross sectional view of a near infrared spectrometry device.

FIG. 2 illustrates the first till fourth near infrared PIN diodes 61(1)-61(4), the guard PIN diode 60, and the three PIN diodes 66(1)-66(3) that form the three floating guard rings.

Figure 3:
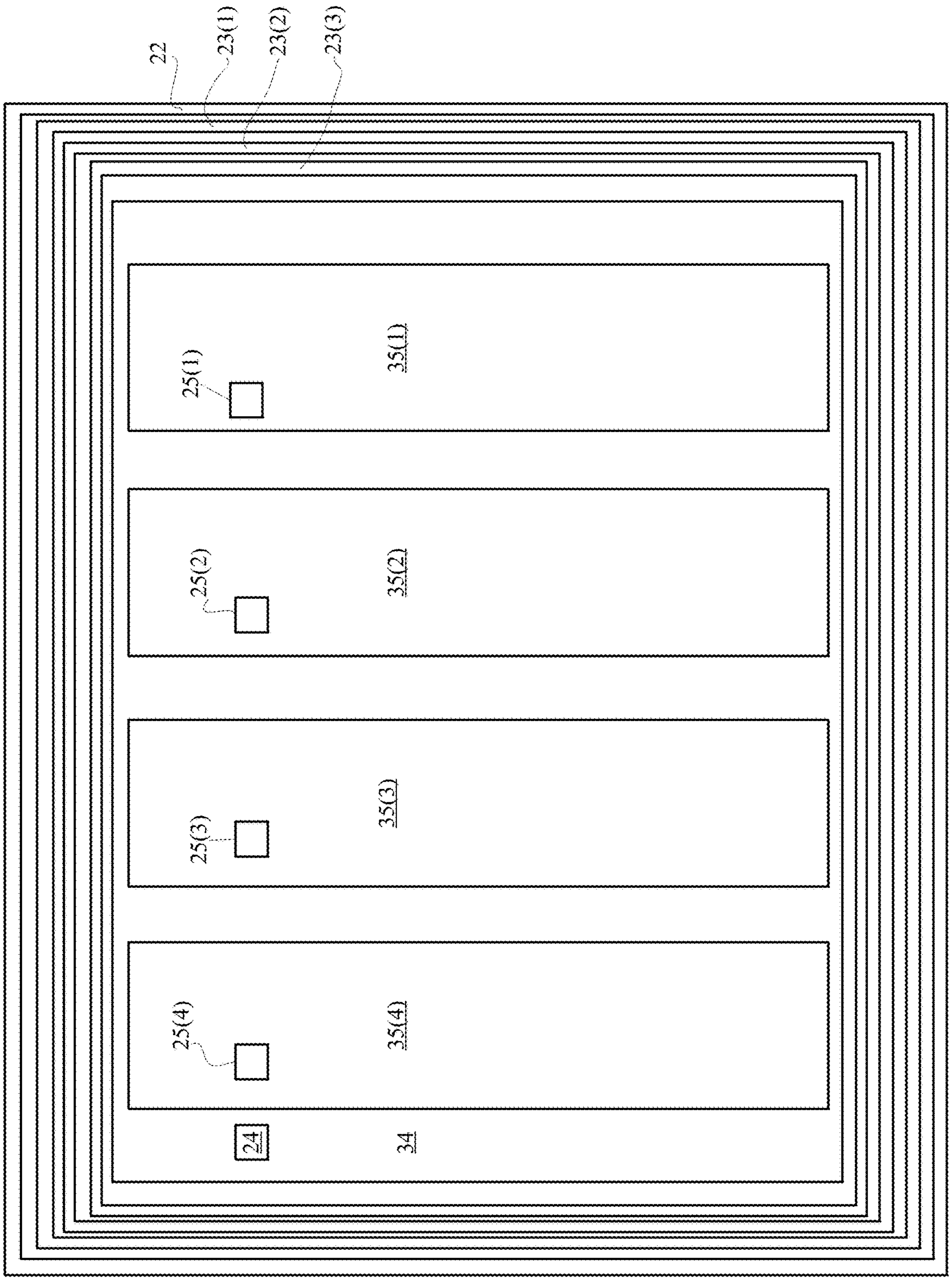
FIG. 3 illustrates an example of a top view of a near infrared spectrometry device.

FIG. 3 is a top view of the near infrared spectrometry device 11 in which (for simplicity of explanation) the top oxide region 30 is not shown.

FIG. 3 illustrates external floating ring top contact 22, floating guard rings top contacts 23(1)-23(3), guard PIN diode top contact 24, different near infrared PIN diodes top contacts 25(1)-25(4), guard PIN diode p-type region 34, different near infrared PIN diodes p-type regions 35(1)-35(4).

Figure 4:
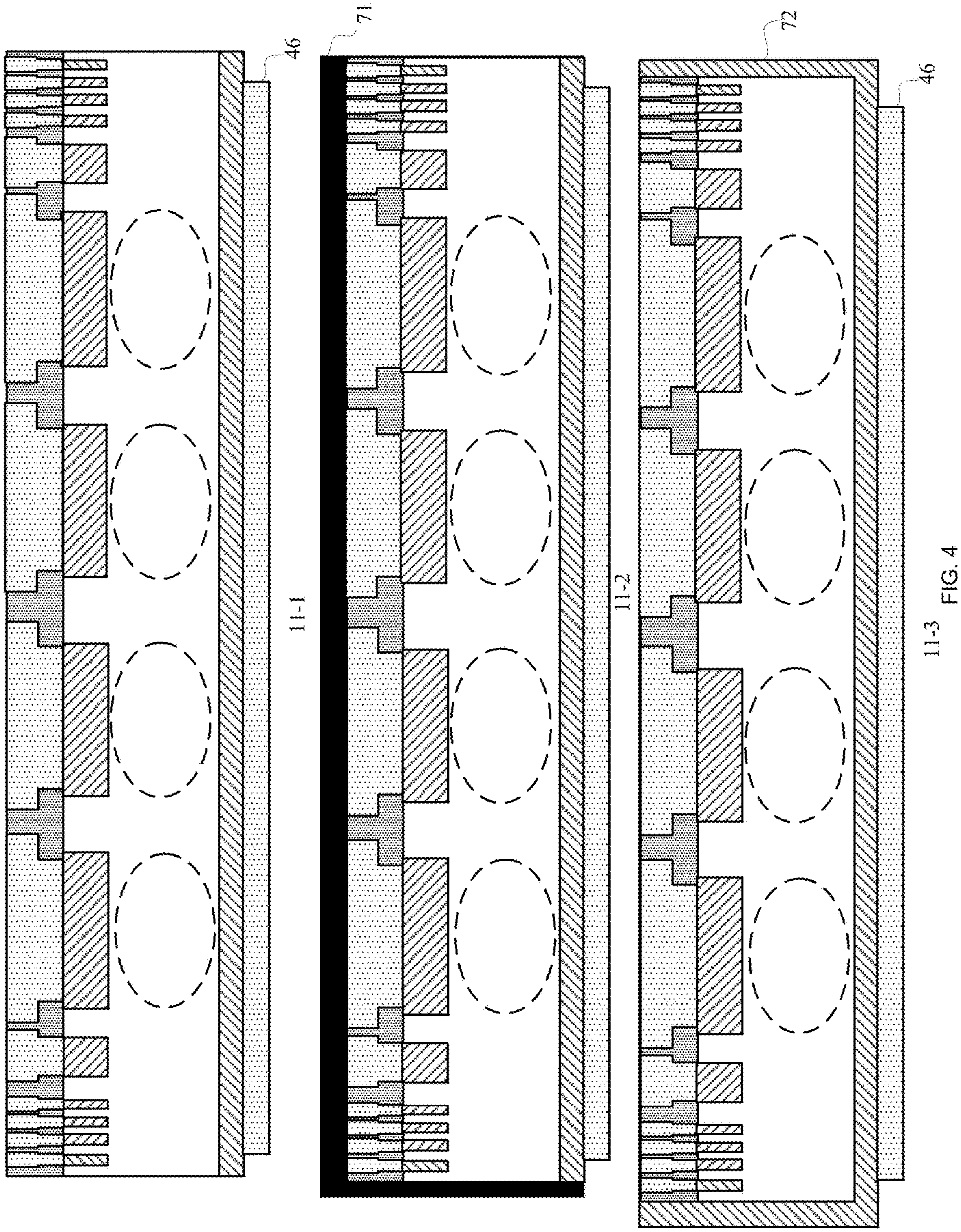
FIG. 4 illustrates examples of cross sectional view of a near infrared spectrometry devices.

FIG. 4 illustrates examples of:

a. Near infrared spectrometry device 11-1 in which the separate bottom metal contacts are replaced by a single continuous backside metal contact 46. The single continuous backside metal contact 46 may be used for shielding the bottom of the near infrared spectrometry device 11-1 from unwanted radiation. The single continuous backside metal contact 46 can span along 5% till 100% or 20%-80% of 50%-90% of the area of the bottom of the near infrared spectrometry device 11-1.

b. Near infrared spectrometry device 11-2 that include shielding elements 71 that shield the top and the other side edge of the near infrared spectrometry device 11-2 from unwanted radiation.

c. Near infrared spectrometry device 11-3 that includes the single continuous backside metal contact 46, as well as highly doped n-type semiconductor regions 72 located at the side edge and the other side edge of the near infrared spectrometry device 11-3. These highly doped n-type semiconductor regions collect electron-hole pairs generated due to defects of the side edge and of the other side edge—and reduce (and even eliminated) noise generated by such defects.

Figure 5:
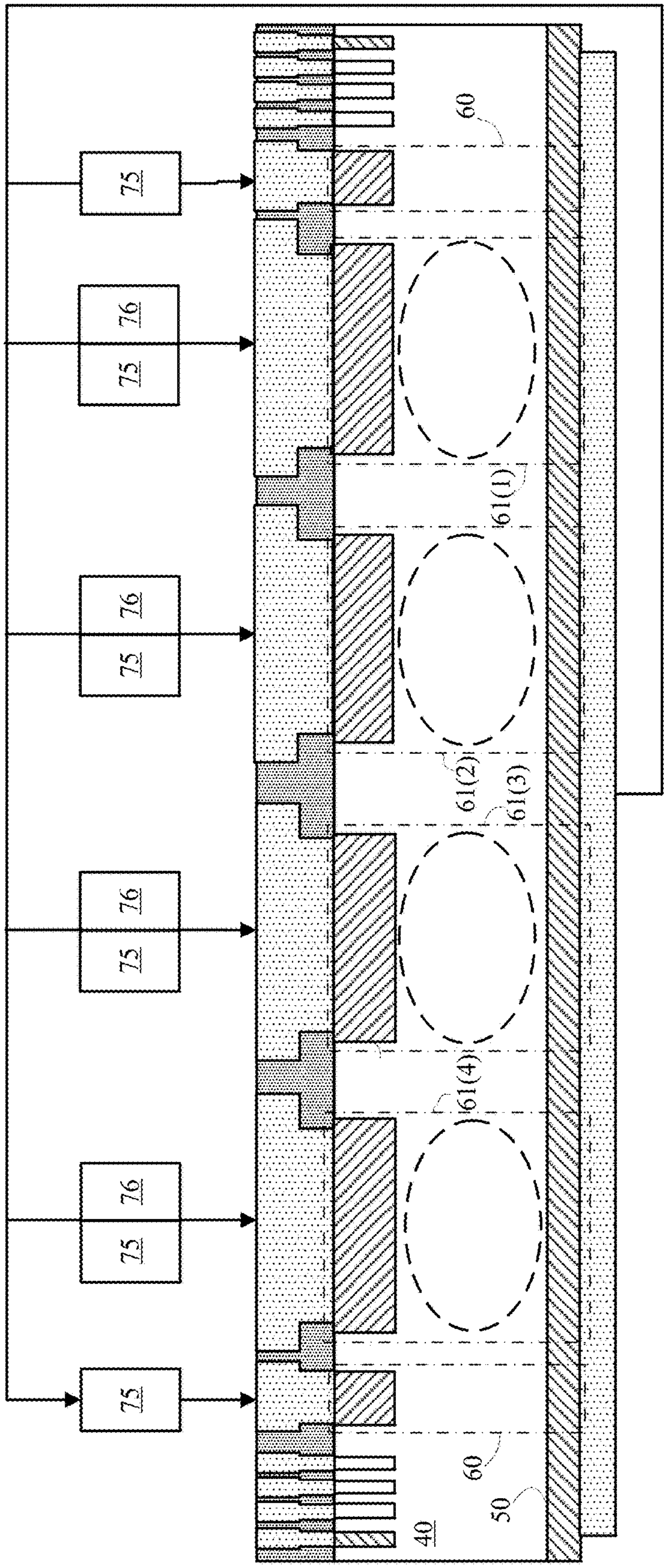
FIG. 5 illustrates an example of a cross sectional view of a near infrared spectrometry device, and also illustrates an example of biasing circuits and measurement circuits.

FIG. 5 illustrates an example of near infrared spectrometry device 11 as well as biasing circuits 75 and readout circuits 76. A biasing circuit 75 is provided per each PIN diode of the multiple PIN diodes. A readout circuit 76 is provided per each near infrared PIN diode for reading the detection signal (for example current) outputted by the near infrared PIN diode that represents a value of a near infrared radiation of a near infrared wavelength associated with the near infrared PIN diode that reached the near infrared PIN diode. FIG. 5 also illustrates the guard PIN diode 60 and the four near infrared PIN diodes 61(1)-61(4).

It should be noted that the guard PIN diode may also be coupled to a measurement circuit.

Figure 6:
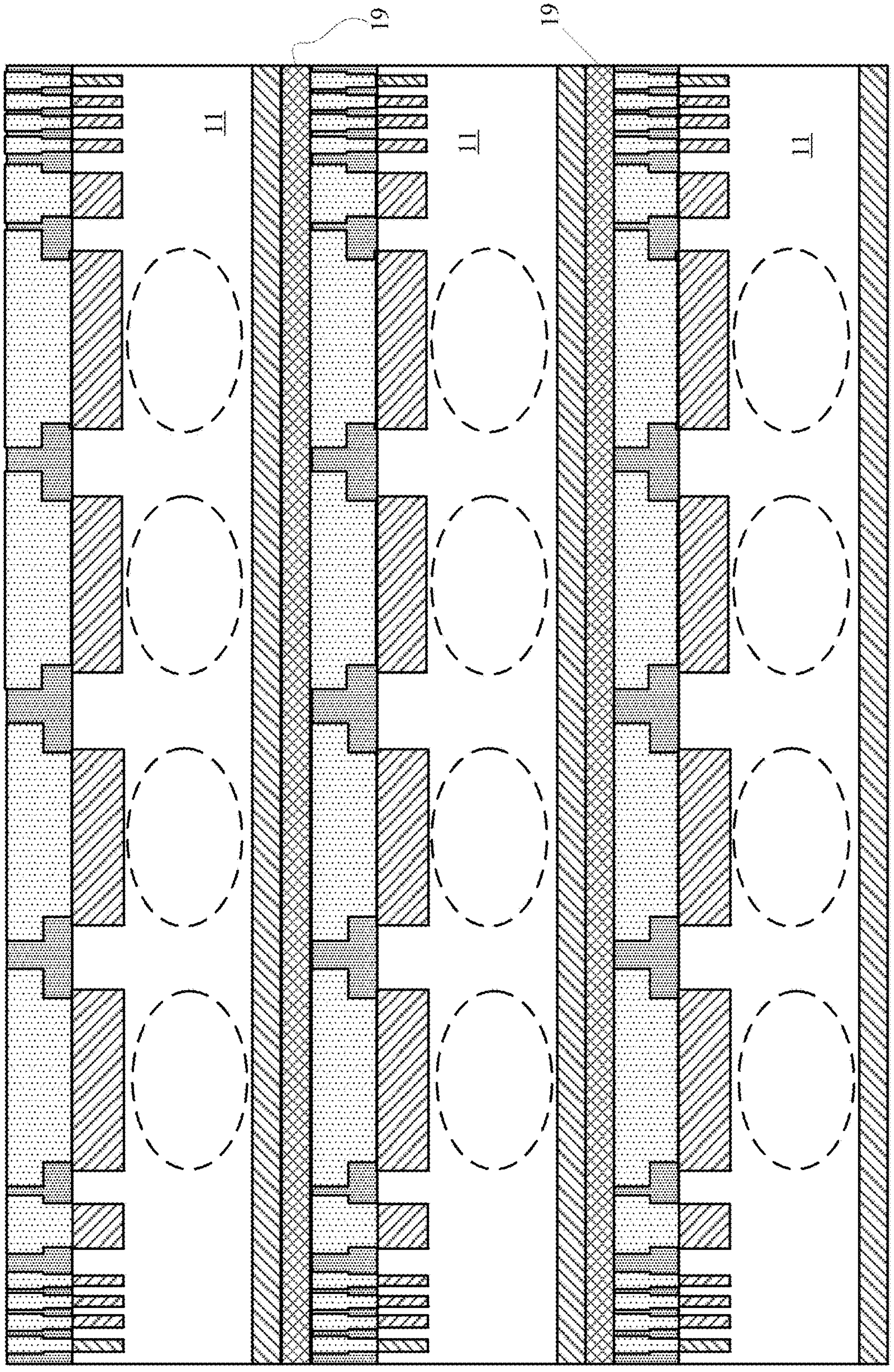
FIG. 6 illustrates an example of a stack of near infrared spectrometry devices.

FIG. 6 illustrates an example of a stack of three near infrared spectrometry devices 11. The stack may include two or more than three near infrared spectrometry devices. Using multiple near infrared spectrometry devices assists in increasing the signal to noise ratio of the detected signals. For simplicity of explanations one or more biasing circuits for biasing the stacks are not shown.

FIG. 6 also illustrates separation layers 19 for isolating one or more bottom metal contacts of one near infrared spectrometry device from top metal contacts of an adjacent near infrared spectrometry device.

Figure 7:
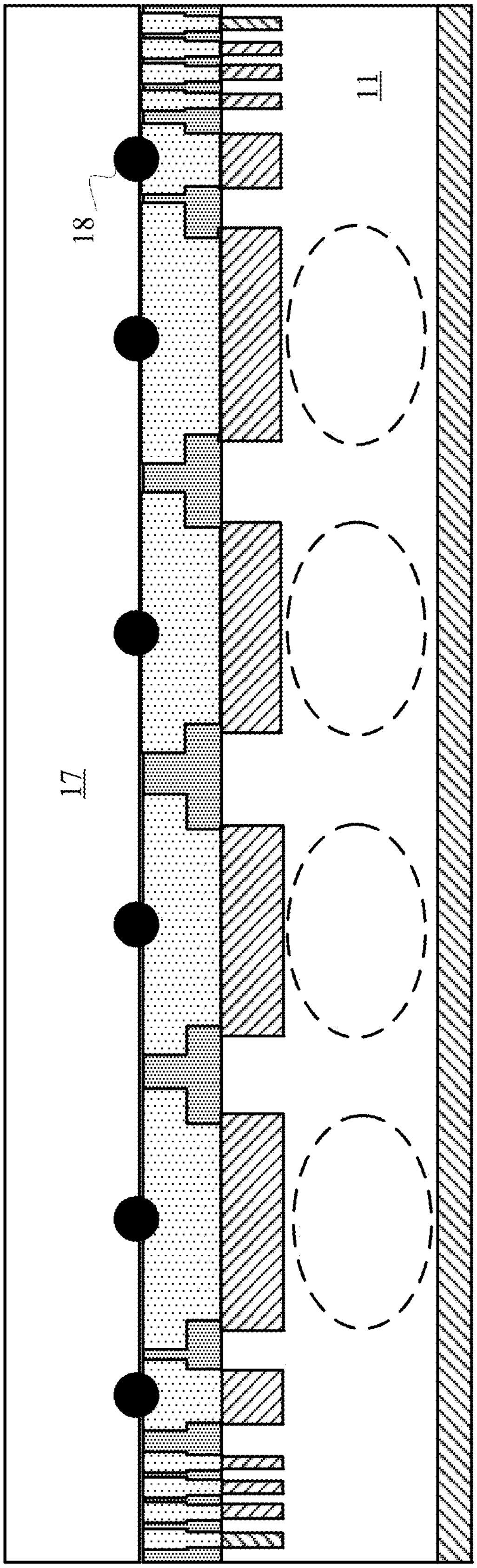
FIG. 7 illustrates an example of a cross sectional view of a near infrared spectrometry device and of an additional chip.

FIG. 7 illustrates an example of near infrared spectrometry device 11 that is electrically coupled to a circuit integrated circuit 17 using chip-to-chip interconnects 18.

Figure 8:
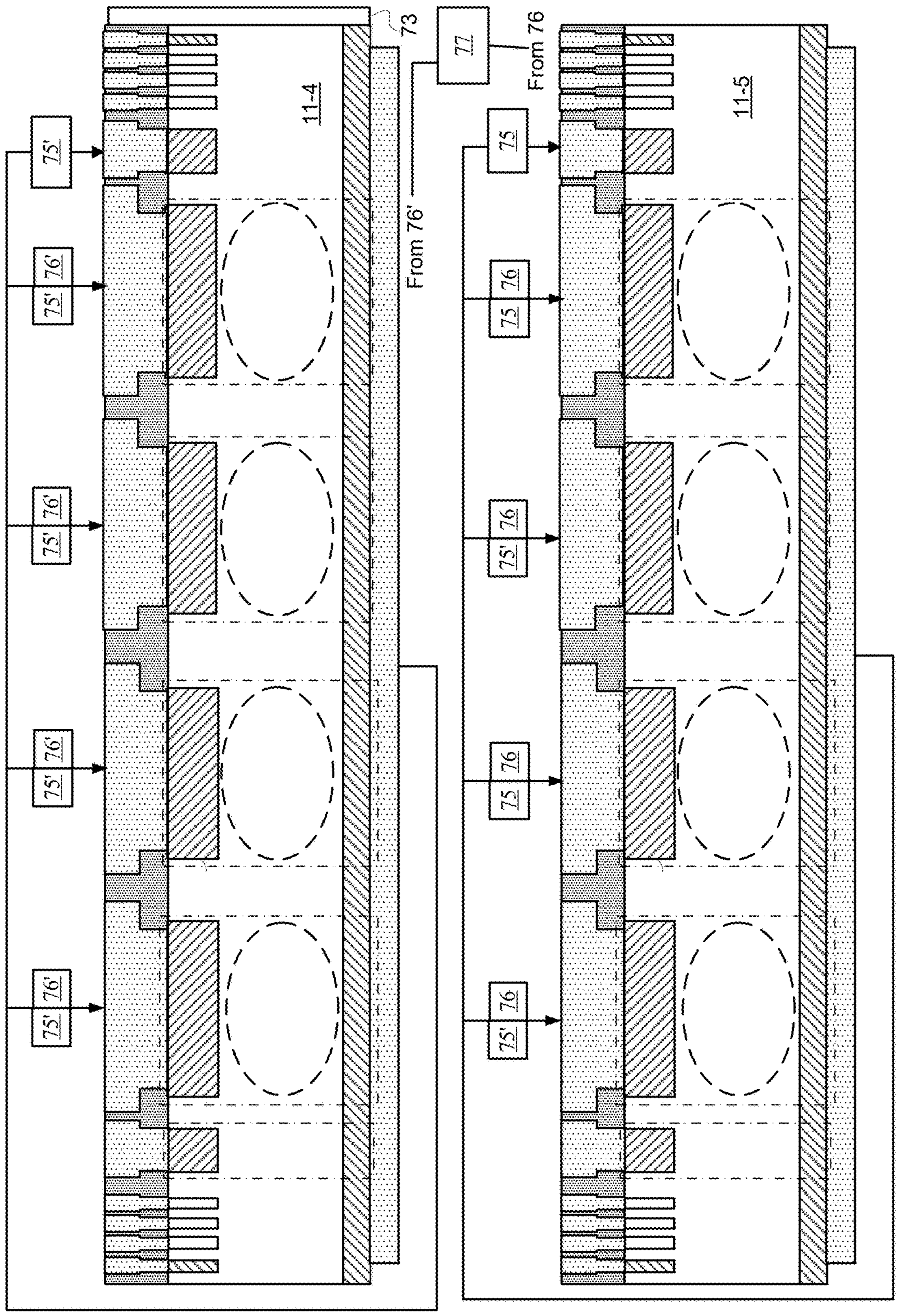
FIG. 8 illustrates an example of a near infrared spectrometry device, of a reference near infrared spectrometry device and of additional circuits.

FIG. 8 illustrates an example of near infrared spectrometry device 11-5 used to measure near infrared radiation and a reference near infrared spectrometry device 11-4.

The near infrared spectrometry device 11-5 is coupled to biasing circuits 75 and measurement circuits 76. The reference near infrared spectrometry device 11-4 is coupled to reference biasing circuits 75' and to reference measurement circuits 76'.

The reference near infrared spectrometry device 11-4 differs from the near infrared spectrometry device 11-5 by having the side edge shielded by shield 73—so that it does not sense the near infrared radiation of interest.

By subtracting a detection signal detected by a reference measurement circuit 76' from a corresponding (related to the same wavelength) measurement circuit 76—the noise detected by the near infrared spectrometry device 11-5 (at that wavelength) is detected—and can be subtracted from the overall signal detected by the near infrared spectrometry device 11-5 to provide more accurate information about the near infrared radiation that impinged on the side edge.

Comparator 77 is configured to make this comparison—for example per each of the four near infrared PIN diodes—or for only some of the four near infrared PIN diodes.

Figure 9:
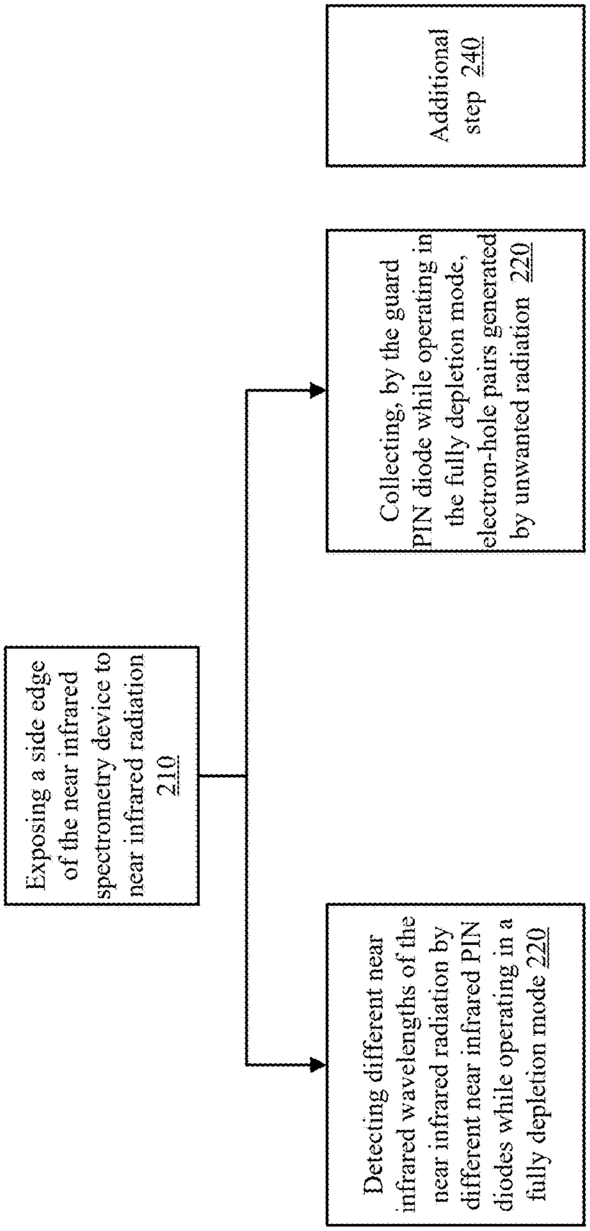
FIG. 9 is example of a method.

FIG. 9 illustrates an example of method 200 for near infrared spectrometry.

According to an embodiment the method includes:

a. Step 210 of exposing a side edge of the near infrared spectrometry device to near infrared radiation.

b. Step 220 of detecting different near infrared wavelengths of the near infrared radiation by different near infrared PIN diodes while operating in a fully depletion mode, the different near infrared PIN diodes are spaced apart from each other and are located at different lateral positions that correspond to absorption depths of the different wavelengths of the near infrared radiation. The detecting includes collecting, by each near infrared PIN diode of the different near infrared PIN diodes, electron-hole pairs generated by the radiation device at a wavelength having an absorption depth that corresponds to a lateral position of the near infrared PIN diode.

c. Step 230 of collecting, by the guard PIN diode while operating in the fully depletion mode, electron-hole pairs generated by unwanted radiation that passed through the side edge of the near infrared spectrometry device and preventing, by the guard PIN diode, the electron-hole pairs generated by unwanted radiation to reach any of the different near infrared PIN diodes.

d. Additional step 240. According to an embodiment, the additional step 240 includes at least one of:

i. Biasing the near infrared spectrometry device.

ii. Preventing damage, by one or more floating guard rings of the near infrared spectrometry device, due to potential differences between multiple PIN diodes and an exterior of the multiple PIN diodes, the multiple PIN diodes include the different near infrared PIN diodes and the guard PIN diode.

iii. Equalizing a potential outside the one or more floating guard rings by an external floating ring that surrounds the one or more floating guard rings.

iv. Shielding a top of the near infrared spectrometry device from unwanted radiation by one or more shielding elements.

v. Shielding another side edge of the near infrared spectrometry device from unwanted radiation by one or more shielding elements According to an embodiment, step 220 includes measuring, by one or more measurement circuits the radiation detected by one or more near infrared PIN diode of the different near infrared PIN diodes.

Any reference to any of the terms "comprise", "comprises", "comprising" "including", "may include" and "includes" may be applied to any of the terms "consists", "consisting", "consisting essentially of". For example—any of the rectifying circuits illustrated in any figure may include more components that those illustrated in the figure, only the components illustrated in the figure or substantially only the components illustrated in the figure.

In the foregoing detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A near infrared spectrometry device, comprising:

multiple PIN diodes, wherein the multiple PIN diodes comprise:

different near infrared PIN diodes that are spaced apart from each other and are located at different lateral positions that correspond to absorption depths of different wavelengths within the near infrared wavelength range; wherein each near infrared PIN diode of the different near infrared PIN diodes, once operated in a fully depletion mode, is configured to collect electron-hole pairs generated by radiation that passes through a side edge of the near infrared spectrometry device at a wavelength having an absorption depth that corresponds to a lateral position of the PIN diode; and a guard PIN diode that is located at a lateral position that corresponds to a distance from the side edge that exceeds an absorption depth of visible light, wherein once operated in the fully depletion mode, the guard PIN diode is configured to collect electron-hole pairs generated by unwanted radiation that passed through the side edge of the near infrared spectrometry device and to prevent the electron-hole pairs generated by unwanted radiation to reach any of the different near infrared PIN diodes.

2. The near infrared spectrometry device according to claim 1, comprising one or more floating guard rings that surround the multiple PIN diodes.

3. The near infrared spectrometry device according to claim 2, further comprising an external floating ring that surrounds the one or more floating guard rings.

4. The near infrared spectrometry device according to claim 1, wherein the external floating ring is in contact with a semiconductor region that is doped with a same type of dopant as the multiple PIN diodes.

5. The near infrared spectrometry device according to claim 1, further comprising one or more shielding elements that are configured to shield a top of the near infrared spectrometry device from visible light.

6. The near infrared spectrometry device according to claim 1, further comprising one or more shielding elements that are configured to shield another side edge of the near infrared spectrometry device from visible light.

7. The near infrared spectrometry device according to claim 1, further comprising continuous backside metal contact that is electrically coupled to n-type semiconductor regions of the different PIN diodes.

8. The near infrared spectrometry device according to claim 1, wherein each PIN diode of the multiple PIN diodes comprises a p-type semiconductor region, and wherein each p-type semiconductor region is electrically coupled to a metal contact.

9. The near infrared spectrometry device according to claim 1, further comprising a biasing circuit that is configured to bias the multiple PIN diodes to operate in the fully depletion mode.

10. The near infrared spectrometry device according to claim 1, wherein the different near infrared PIN diodes are of a same width.

11. The near infrared spectrometry device according to claim 1, wherein the different near infrared PIN diodes comprise two near infrared PIN diodes that differ from each other by width.

12. A method for near infrared spectrometry, comprising:

exposing a side edge of the near infrared spectrometry device to near infrared radiation;

detecting different near infrared wavelengths of the near infrared radiation by different near infrared PIN diodes while operating in a fully depletion mode, the different near infrared PIN diodes are spaced apart from each other and are located at different lateral positions that correspond to absorption depths of the different wavelengths of the near infrared radiation; wherein the detecting comprises collecting, by each near infrared PIN diode of the different near infrared PIN diodes, electron-hole pairs generated by the radiation device at a wavelength having an absorption depth that corresponds to a lateral position of the near infrared PIN diode; and collecting, by the guard PIN diode while operating in the fully depletion mode, electron-hole pairs generated by unwanted radiation that passed through the side edge of the near infrared spectrometry device and preventing, by the guard PIN diode, the electron-hole pairs generated by unwanted radiation to reach any of the different near infrared PIN diodes.

13. The method according to claim 12, comprising preventing damage, by one or more floating guard rings of the near infrared spectrometry device, due to potential differences between multiple PIN diodes and an exterior of the multiple PIN diodes, the multiple PIN diodes comprises the different near infrared PIN diodes and the guard PIN diode.

14. The method according to claim 13, comprising equalizing a potential outside the one or more floating guard rings by an external floating ring that surrounds the one or more floating guard rings.

15. The method according to claim 12, further comprising shielding a top of the near infrared spectrometry device from visible light by one or more shielding elements.

16. The method according to claim 12, further comprising shielding another side edge of the near infrared spectrometry device from visible light by one or more shielding elements.

17. The method according to claim 12, wherein the biasing comprises supplying a bias signal to a continuous backside metal contact that is electrically coupled to n-type semiconductor regions of the different near infrared PIN diodes.

18. The method according to claim 12, wherein each PIN diode of multiple PIN diodes comprises a p-type semiconductor region, and wherein each p-type semiconductor region is electrically coupled to a metal contact, the multiple PIN diodes comprises the different near infrared PIN diodes and the guard PIN diode.

19. The method according to claim 12, wherein the different near infrared PIN diodes are of a same width.

20. The method according to claim 12, wherein the different near infrared PIN diodes comprise two PIN diodes that differ from each other by width.

* * * * *